(12) United States Patent
Abbaszadeh et al.

(10) Patent No.: US 8,266,493 B1
(45) Date of Patent: Sep. 11, 2012

(54) LOW-DENSITY PARITY CHECK DECODING USING COMBINED CHECK NODE AND VARIABLE NODE

(75) Inventors: Ayyoob Abbaszadeh, Salt Lake City, UT (US); Ryan Hinton, Crozet, VA (US)

(73) Assignee: L-3 Communications, Corp., New York, NY (US)

( * ) Notice: Subject to any disclaimer, the term of this patent is extended or adjusted under 35 U.S.C. 154(b) by 1122 days.

(21) Appl. No.: 11/971,876

(22) Filed: Jan. 9, 2008

(51) Int. Cl.
*H03M 13/00* (2006.01)
*H03M 13/03* (2006.01)
*G11C 29/00* (2006.01)
*H04N 7/12* (2006.01)

(52) U.S. Cl. ... 714/752; 714/763; 714/786; 375/240.24; 375/240.27; 375/341

(58) Field of Classification Search ............... 714/752, 714/763, 786; 375/341, 240.24, 240.27
See application file for complete search history.

(56) References Cited

U.S. PATENT DOCUMENTS

| | | | |
|---|---|---|---|
| 6,539,367 B1 | 3/2003 | Blanksby et al. | |
| 6,938,196 B2 * | 8/2005 | Richardson et al. | 714/752 |
| 7,139,959 B2 | 11/2006 | Hocevar | |
| 7,178,080 B2 | 2/2007 | Hocevar | |
| 7,281,192 B2 * | 10/2007 | Shen et al. | 714/757 |
| 7,296,208 B2 * | 11/2007 | Sun et al. | 714/752 |
| 7,454,685 B2 * | 11/2008 | Kim et al. | 714/758 |
| 7,673,223 B2 * | 3/2010 | Richardson et al. | 714/780 |
| 7,814,402 B2 * | 10/2010 | Gaudet et al. | 714/800 |
| 7,941,736 B2 * | 5/2011 | Park et al. | 714/800 |
| 7,958,428 B2 * | 6/2011 | Shen et al. | 714/755 |
| 2007/0168833 A1 * | 7/2007 | Lestable et al. | 714/758 |
| 2009/0070659 A1 * | 3/2009 | Zhong et al. | 714/801 |
| 2010/0275090 A1 * | 10/2010 | Kuri et al. | 714/752 |

OTHER PUBLICATIONS

He et al., An Analysis of the Orthogonality Structures of Convolutional Codes for Iterative Decoding, Sep. 2005, IEEE, vol. 51, No. 9, pp. 3247-3261.*
Mansour, Mohannad, High-Throughput LDPC Decoders, IEEE, Dec. 2003, pp. 976-996, vol. 11, No. 6.
Leiner, Bernhard, LDPC Codes—a brief Tutorial, Apr. 8, 2005, pp. 1-9.
Sun, Jian, An Introductions to Low Density Parity Check (LDPC) Codes, Wireless Communication Research Laboratory, Lane Dept. of Comp. Sci. and Elec. Engr., Jun. 3, 2003, pp. 1-22, West Virginia University.
Blanksby, Andrew J., A 690mW 1-Gb/s 1024-b, Rate-½Low-Density Parity-Check Code Detector, IEEE, Mar. 2002, pp. 404-412, vol. 37, No. 3.
Zhang, Juntan et al., Shuffled Iterative Decoding, IEEE, Feb. 2005, pp. 209-213, vol. 53, No. 2.
Divsalar, Dariush et al., Low-rate LDPC codes with simple protograph structure, 5 pages, California of Institute of Technology.
Yeo, Engling et al., Architectures and Implementations of Low-Density Parity Check Decoding Algorithms, Department of Electrical Engineering and Computer Sciences, University of California, Berkeley, CA, 4 pages.

(Continued)

*Primary Examiner* — John J Tabone, Jr.
(74) *Attorney, Agent, or Firm* — Kirton McConkie; N. Kenneth Burraston (57) ABSTRACT

A technique for decoding low-density parity check codes includes performing a combined check node and variable node calculation. Decoding is initialized using channel likelihood values estimated from a received physical signal. The decoding iteratively updates the variable nodes. Performing a combined check node and variable node calculation can enable reduced memory usage and faster convergence for the decoder.

18 Claims, 8 Drawing Sheets

OTHER PUBLICATIONS

Zhang, Zhengya et al., Investigation of Error Floors of Structured Low-Density Parity-Check Codes by hardware Emulation, Department of Electrical Engineering and Computer Sciences, University of California, Berkeley, CA, 6 pages.

Prabhakar, A et al., Memory Efficient Scalable Decoder Architectures for Low Density Parity Check Codes, Wireless Communication Laboratory, Department of Electrical and Computer Engineering, May 12, 2006, 39 pages, Texas.

Karkooti, Marjan, Semi-Parallel Architectures for Real-Time LDPC Coding, May 2004, Rice University, Houston, Texas.

Gallager, Robert G., Low-Density Parity-Check Codes, 1963, 90 pages, Cambridge, Mass.

* cited by examiner

|   |   |   |   |   |   |   |   |
|---|---|---|---|---|---|---|---|
| 1 | 1 | 0 | 0 | 0 | 0 | 0 | 0 | A
| 0 | 1 | 0 | 0 | 0 | 0 | 1 | 0 | B
| 1 | 0 | 0 | 1 | 0 | 1 | 1 | 0 | C
| 0 | 0 | 0 | 0 | 1 | 1 | 0 | 0 | A
| 0 | 0 | 1 | 0 | 0 | 1 | 0 | 0 | B
| 0 | 1 | 1 | 0 | 1 | 0 | 0 | 1 | C

LOW-DENSITY PARITY CHECK DECODING USING COMBINED CHECK NODE AND VARIABLE NODE

FIELD OF THE INVENTION

The present invention relates generally to the decoding of low-density parity check codes.

BACKGROUND

Low-density parity check (LDPC) codes are block codes that can provide highly efficient error correction coding (approaching the Shannon limit for large block sizes). LDPC codes introduce redundancy into the transmitted code word in such a way that the parity check matrix is sparse (i.e., has few 1's in each row and column). This enables efficient decoding algorithms based on belief propagation.

Typical decoding uses a two stage process based on the Tanner graph of the code. Variable node computation units pass messages to check node computation units indicating likelihood for current variable values. Check node computation units then determine update messages which are passed back to the variable node computation units. Each check node receives messages from those variable computation nodes that are a part of its parity check equation, and sends update messages back to the variable computation nodes. The variable nodes recompute variable likelihoods. The process iterates until the code word passes parity check or a preset number of iterations passes.

Unfortunately, the decoding process is expensive in terms of memory and processing time. A decoder can be partitioned to perform parallel operations by providing separate computation units for each variable and check node. A parallel implementation can be very fast, however, interconnection between the many computation units can be difficult. A parallel implementation also uses a large amount of real estate within an integrated circuit or gate array.

Alternately, a serial decoder can be implemented using a single variable computation unit and a single check computation unit. Interconnection between the computation units is straightforward and real estate usage is relatively small. Processing is slow, however, as the variable computation unit and check computation unit must each sequentially cycle through all of the nodes.

Hybrid serial-parallel implementations are known, where a number of variable computation and a number of check computations are multiplexed for processing of a subset of the variable nodes and check nodes. A serial-parallel implementation provides a tradeoff between speed and real estate requirements. Unfortunately, serial-parallel implementations can be difficult to design. In particular, interconnection can be difficult if check node computation units need connections to every variable node computation unit. Memory storage for variable likelihoods and check node messages can be difficult, as memories typically only provide one or two read/write ports, and memory conflicts can occur. When the design is constrained by additional requirements (e.g., a particular gate array architecture or silicon real-estate limitation) design requirements can be difficult to meet.

As a particular example, in designing an LDPC decoder for implementation in a field programmable gate array (FPGA), clock rates are limited relative to custom integrated circuit designs. This makes serial implementations too slow in some applications. Parallel implementations, however, result in routing complexity difficult to accommodate. Straightforward semi-parallel implementations can require larger amounts of memory than available on an FPGA.

SUMMARY OF THE INVENTION

It has been recognized that it would be advantageous to develop improved decoding architectures for decoding of low-density parity check codes.

One embodiment of the present invention is a decoder for low-density parity check codes. The decoder can include a plurality of first memories to provide storage for a plurality of variable node likelihood values. One or more node processors can be coupled to the first memories and configured to perform a combined check node and variable node update to update the variable node likelihood values. A plurality of second memories can be coupled to the node processors, each second memory being associated with a node processor and having storage for a plurality of check to variable node messages.

In another embodiment of the present invention a decoder for low-density parity check codes can include a means for receiving a physical signal and estimating a plurality of channel likelihood values for symbols encoded within the signal. The decoder can also include means for initializing a plurality of variable nodes with values of the corresponding plurality of channel likelihood values. Means for repeatedly updating a subset of the variable nodes using a combined check node and variable node calculation can be based on the subset of the variable nodes and a subset of the check nodes. The repeated updating can occur until all of the variable nodes have been updated. The decoder can also include means for forming data decisions from the variable nodes.

Another embodiment of the present invention includes a method of decoding a low-density parity check code. The method can include receiving a physical signal and estimating a plurality of channel likelihood values for symbols encoded within the signal. A plurality of variable nodes can be initialized with values of the corresponding plurality of channel likelihood values. The method can include performing a combined check node and variable node calculation. The combined check node and variable node calculation can update a subset of the check nodes and a subset of the variable nodes, and can be repeated until all of the variable nodes are updated. Updates of the variable nodes are repeated until a predefined exit criterion is reached. The method can include forming data decisions from the variable nodes and outputting the data decisions.

BRIEF DESCRIPTION OF THE DRAWINGS

Additional features and advantages of the invention will be apparent from the detailed description which follows, taken in conjunction with the accompanying drawings, which together illustrate, by way of example, features of the invention; and, wherein:

FIG. 7 (*a*) and FIG. 7(*b*) are a block diagram of a detailed implementation of an LDPC decoder in accordance with an embodiment of the present invention.

DETAILED DESCRIPTION

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

Within the document, the following conventions are used. Matrices are represented by upper case bold characters (e.g., A, B, H). Vector quantities are represented using lower case bold characters (e.g., c, u, p), while scalar quantities are represented using lower case italic characters (e.g., n, m, k). While discussion throughout this document is represented using column vectors, it should be appreciated that operation using row vectors can also be performed using appropriate transposition of matrices and ordering of multiplication.

Figure 1:
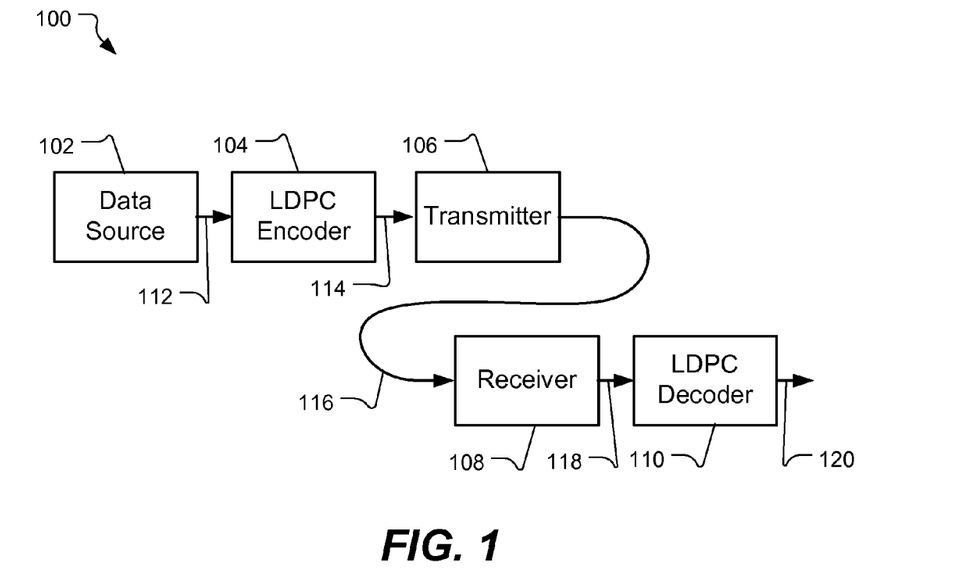
FIG. 1 is a block diagram of a communication system using an LDPC decoder in accordance with an embodiment of the present invention.

FIG. 1 illustrates a block diagram of a communication system which includes low-density parity check (LDPC) encoding and decoding. The system, shown generally at 100, includes a data source 102, an LDPC encoder 104, a transmitter 106, a receiver 108, and a LDPC decoder 110. Source data 112 from the data source is accepted by the low-density parity check encoder and encoded to incorporate redundancy into the encoded data 114. For example, the encoder may produce two output data bits for each input data bit, three output bits for each input bit, four output bits for each three input bits, or other ratios of encoded data to source data as are known in the art. While binary data encoding is typically used, the techniques described herein are not limited to binary data, and higher order data encoding alphabets can also be used with appropriate modification of the modulus of arithmetic.

The encoder 104 can encode the data using various techniques. For example, encoded data can be obtained by placing the source data into a vector and multiplying the source data by a generator matrix to obtain the encoded data. Other approaches can also be used, including for example, using a decoder to construct parity bits by performing decoding on the transmit bits wherein the parity bits are treated as erasures. As yet another example, the encoder can be implemented using techniques described in commonly-owned co-pending U.S. patent application Ser. No. 11/971,875, entitled "Encoder for Low-Density Parity Check Codes (pending), filed the same day as the present application, and herein incorporated by reference.

The encoded data 114 is transmitted as symbols encoded into a physical signal 116 by the transmitter 106. Various ways of encoding symbols into a physical signal are known, including for example, using amplitude modulation, frequency modulation, phase modulation, or combinations thereof. Particular examples include binary phase shift keying, quadrature phase shift keying, and quadrature amplitude modulation.

The physical signal 116 is communicated to the receiver 108. For example, the physical signal may pass through a wired or wireless communications channel. For example, wireless communications channels include radio communications channels, optical communications channels, and acoustic communications channels. As another example, the physical signal may be communicated via a memory medium, wherein transmission includes recording onto the memory medium and reception includes reading from the memory medium.

Reception of the physical signal 116 at the receiver 108 may be corrupted by noise, interference, and other error sources. For example, noise may be additive noise caused by thermal effects within the front end of the receiver, atmospheric effects, or other sources.

The system 100 includes a means for receiving the physical signal and estimating a plurality of channel likelihood values for the symbols encoded within the physical signal, such as a receiver 108. The receiver may include, for example, an antenna, downconverter, demodulator, tracking loop(s), deinterleaver, and similar components as used in communications systems.

The receiver 108 provides channel likelihood values 118 to the LDPC decoder 110 for decoding. The channel likelihood values represent likelihoods of the received data. For example, for binary data transmission (data representing '1' and '0') the likelihood can be expressed as a log-likelihood ratio of the probability that a '0' was transmitted divided by the probability that a '1' was transmitted. Other definitions of the channel likelihood can be used as are known in the art. The LDPC decoder performs iterative decoding until either the received data passes parity check (as detailed further below), a predetermined number of iterations have been reached, or based on other criteria. For example, the allowed number of iterations may vary with time, allowing more iterations for data blocks having difficult errors and fewer iterations for data blocks having easily-corrected errors or no errors. Decoding time may, for example, be dynamically varied, providing variable decoding time per block while maintaining a desired level of throughput.

An (n,k) LDPC code has a length n and includes m=n−k parity symbols, and can be represented by an m×n parity check matrix $H=[h_{ij}]_{m \times n}$. A code word vector c when multiplied by the parity check matrix H produces a zero vector, Hc=0. The received data r, however, may not be a code word if errors have occurred during transmission, that is Hr≠0. In such a case, one or more symbols (or bits) of the received data are incorrect. The decoder iterates, attempting to correct errors and determine the correct received data $\tilde{r}$ corresponding to what was transmitted, such that H$\tilde{r}$=0. Further details of the LDPC decoder are provided below.

Decoded data 120 can be output from the decoder 110. For example, decoded data may be passed on to other electronic equipment for further use in the form of an electronic signal (e.g., a digital logic signal) for additional processing, or the decoded data may be stored in a memory for later use (e.g., in a digital or numeric form). As another example, the decoded data may be printed or displayed for a user.

Figure 2:
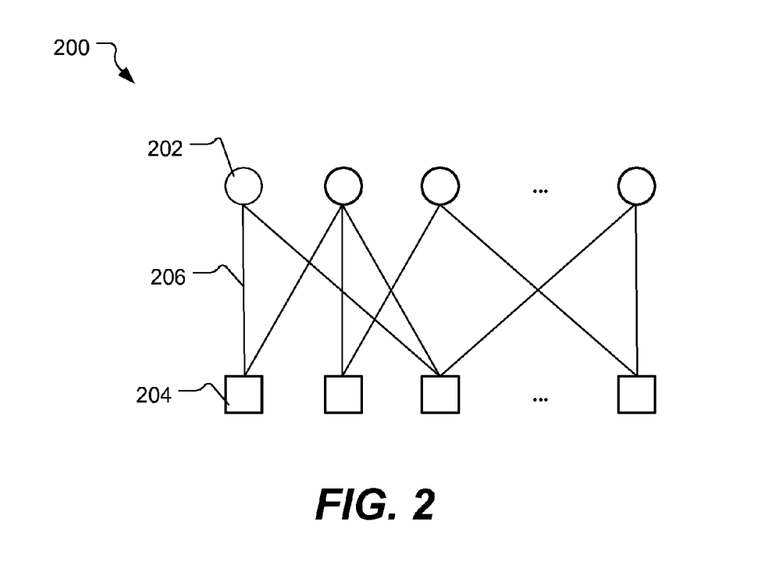
FIG. 2 is a Tanner graph of an LDPC code.

Turning to the decoder in detail, FIG. 2 illustrates one possible implementation of an LDPC decoder using a message-passing structure. The decoder 200 includes a plurality of variable nodes 202 (shown as circles) and a plurality of m check nodes 204 (shown as squares). The variable nodes determine the likelihoods of the symbols within the transmitted code word (data symbols and parity symbols) based on the received data and updates from the check nodes, and thus there are n variable nodes corresponding to the n columns of H. The check nodes perform checks according to the parity check equations of the LDPC code (one check node per row of the H matrix), and provide updates to the variable nodes based on the results of those checks, and thus there are m check nodes corresponding to the m rows of H. Generally, the number of parity symbols is equal to m, although a parity check matrix may have redundant (linearly dependent) rows such that m is greater than the number of parity symbols. Each check node is connected to one or more variable nodes via connections 206 corresponding to the terms of H. In other words, check node i is connected to variable node j if the entry $h_{ij}$ of H is 1. The connections are used for message passing during decoding iterations.

Decoding begins with initialization of the variable nodes 202 using (intrinsic) likelihood values $\{\lambda_j\}$, $j=1\ldots n$, received from the receiver 108. For example, initialization may be performed by writing the likelihood values from the receiver into the variable node memories. Messages $\{Q_{ji}\}$ (message $Q_{ji}$ is from variable node j to check node i) are passed from the variable nodes to the check nodes 204 via the connections 206. The check node operators determine updates to be provided to variable node likelihoods and pass the appropriate messages $\{R_{ij}\}$ back to the variable nodes, $i=1\ldots m$. Various algorithms for estimating variable node likelihoods can be used, as described further below.

For example, in hard decision decoding, likelihoods can be truncated to either 0 or 1. Each check node represents one of the parity check constraints. Accordingly, the check node can perform a modulo-2 sum of the attached variable nodes. If the sum is zero, then the check node passes messages back to each variable node telling it that the variable node value appears correct. If the check node result is non-zero, then the check node passes messages back to each variable node telling it that the variable node value appears incorrect. Each variable node then performs a majority vote using the check node messages, and changes its value if there are more messages that say 'incorrect' than say 'correct'. The process iterates until all of the check node values are zero (indicating a code word has been found), a fixed number of iterations has occurred, or a cycle (where the same sequences are being repeated) is detected. It will be appreciated that, while having all check node results of zero generally indicates that correct decoding has occurred, there is a small probability that the decoding will result in a codeword (i.e. parity check of zero) that is different than the transmitted code word when there are a large number of errors introduced in the channel.

Soft decision decoding proceeds similarly as just described, except that the messages include likelihood values. In particular, for iteration k, variable node to check node messages $Q_{ji}[k]$ are formed:

$$Q_{ji}[k] = \lambda_j + \sum_{\substack{i'=1\ldots m \\ i' \neq j}} R_{i'j}[k-1]$$

and check node to variable node messages $R_{ij}[k]$ are formed $$R_{ij}[k] = \psi^{-1}\left(\sum_{\substack{j'=1\ldots m \\ j' \neq i}} \psi(Q_{j'i}[k-1])\right)$$

The function $\psi^{-1}$ can be defined in various ways. For example, for hard decision deciding, as described above, the function $\psi^{-1}$ is simply modulo-2. For soft decision coding, $$\psi(x) = \psi^{-1}(x) = -\log(\tan h(x/2)).$$

Various approximations to this function can also be used, including for example quantized approximations, piecewise-linear approximations, min, min*, and other algorithms known in the art.

Note that the summations exclude one term. In particular, variable node to check node messages exclude the previously received check node to variable node message (i.e., i'=j). Similarly, check node to variable node messages exclude the previously received variable node to check node message (i.e., j'=i). Note also, that even though the summation is written above as being performed over all $i=1\ldots n$ or $j=1\ldots m$, only terms in the summations corresponding to the '1's in the parity check matrix are actually included. In other words, the summations include messages where there is a corresponding connection 206 present between the variable node 202 and check node 204 for which the summation is being performed.

A means for forming data decisions from the variable nodes can be included in the decoder. For example, data decisions for the variable nodes can be formed by determining the quantities $$\Lambda_j = \lambda_j + \sum_{i=1\ldots m} R_{ij}[k].$$

Hard decisions can then be made based on the sign of $\Lambda_j$.

One disadvantage of the message-passing structure 200 is that the iteration is a two-step process. A first step is the variable node computation and passing messages from variable nodes to check nodes, and a second step is the check node computation and passing messages back from check nodes to variable nodes. Accordingly, decoder throughput can be improved by combining the variable node and check node calculations into a single update process.

Figure 3:
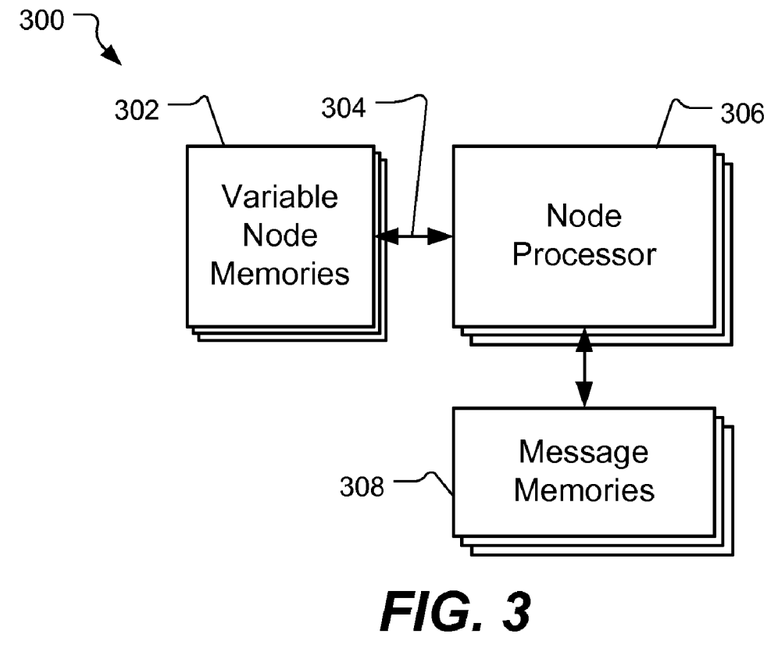
FIG. 3 is a block diagram of an LDPC decoder in accordance with an embodiment of the present invention.

A high-speed decoder using a single-step update process is illustrated in FIG. 3 in accordance with an embodiment of the present invention. The decoder 300 includes a plurality of variable node memories 302 providing storage for a plurality of variable node likelihood values 304. A plurality of node processors 306 are coupled to the variable node memories and are configured to perform a combined check node and variable node update to update the plurality of variable node likelihood values. The node processors provide a means for repeatedly updating a subset of the variable nodes using the combined check node and variable node calculation.

A plurality of message memories 308 are coupled to the node processors 306. The message memories hold local copies of check node to variable node messages $R_{ji}$ to allow formation of variable node to check node messages $Q_{ij}$ from variable node estimates $Q_j$. Variable node memories 302 can be updated based on check node to variable node messages $R_{ji}$, using the relation $$Q_j = \lambda_j + \sum_{i=1\ldots j} R_{ij}.$$

Note that update to the variable node memories 302 can be done on the fly, updating variable node j whenever any $R_{ij}$ message changes. Accordingly, the variable nodes are partially updated by the processing node. Each node processor 306 can update one or more variable nodes stored in the variable node memories 302. For example, a node processor can update variable nodes that it is attached to based on the decoder parity check matrix H. The number of node processors can vary between 1 (for a fully serial implementation) and m (for a fully parallel implementation), with intermediate values corresponding to a semi-parallel implementation. Of course, using a number of node processors greater than 1 and less than m can be advantageous in providing high speed decoding while using a limited amount of circuitry or processing resources.

In a serial or semi-parallel implementation, each node processor 306 is repeatedly exercised to update all of its connected variable node estimates stored in the variable node memories 302 to complete one decoding iteration. The number of repeats depends on the number of node processors 306 (the amount of parallelism) implemented relative to the number of parity check equations of the LDPC code. In particular, for m check nodes, and z node processors, (ceiling of) m/z repeats are used.

The decoding process iterates (each iteration including a number of repeated updates based on the parallelism of the decoder) until a predetermined criterion has been reached. The termination criterion can include any one or more of the following: all check nodes report no errors, a fixed number of iterations have been performed, a repeated cycle of messages has been detected, etc.

Figure 4A:
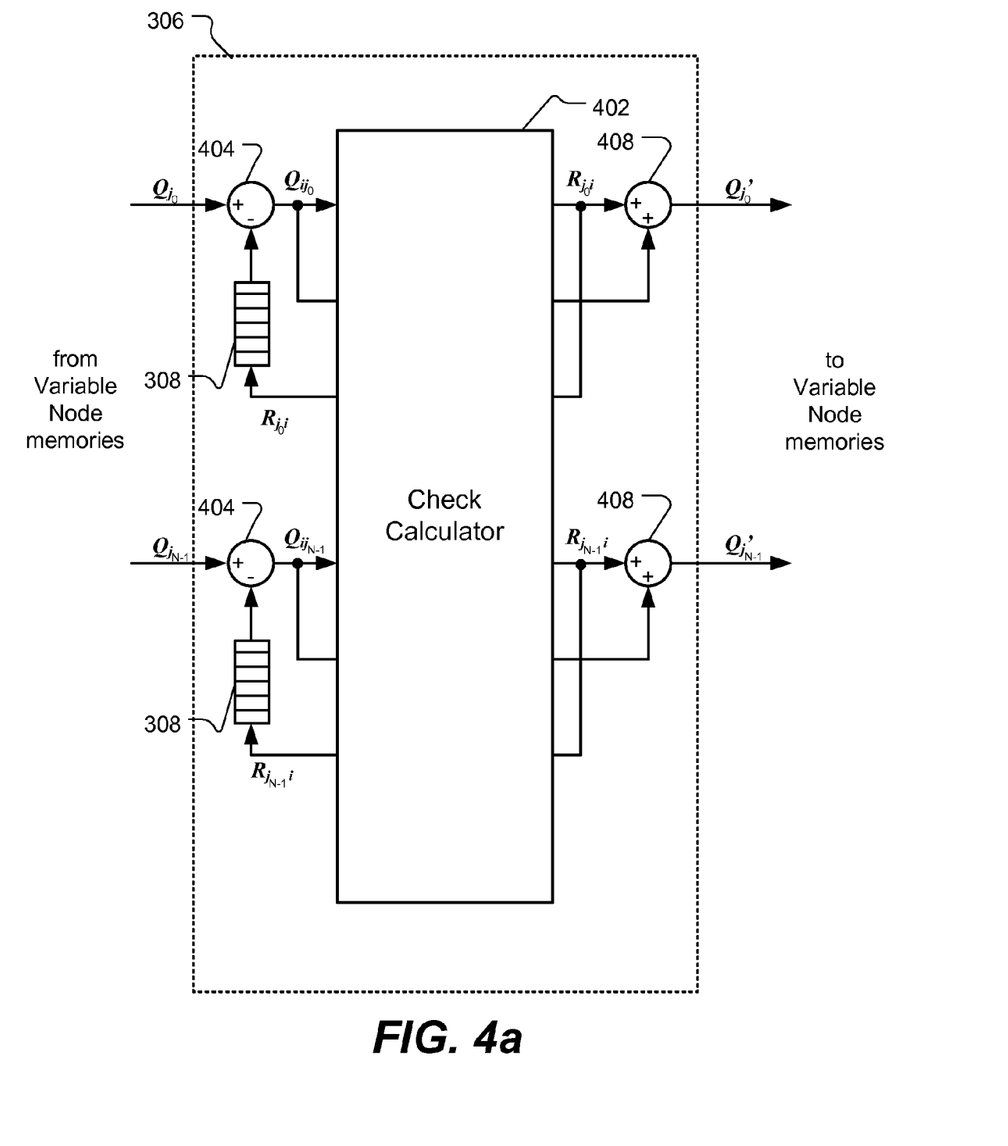
FIG. 4a is a detailed block diagram of one implementation of the node processor of FIG. 3 in accordance with an embodiment of the present invention.

FIG. 4a illustrates a detailed example of one possible implementation of a node processor 306. The node processor is built around a check calculator 402 which receives a plurality of variable node estimates $Q_{i0}$ to $Q_{jN-1}$ from the N−1 variable node memories. The check calculator may, for example, be implemented in combinatorial logic, using a look up table, or other techniques. The node processor derives variable node to check node messages $Q_{ij}$ from variable node estimates $Q_i$ by subtracting (e.g., in subtractors 404) the previous check node to variable node message $R_{ji}$ held in the message memory 308. For example, the memory may be local to the node processor. One check node memory may be used to store all of the variable node likelihood values for each check calculator. The updated variable node estimates $Q_{i0}'$ to $Q_{jN-1}'$ are obtained by adding (e.g., in an adder 408) the new check node messages $R_{j0i}'$ to $R_{jN-1i}'$ to the variable node to check node messages $Q_{i0}$ to $Q_{jN-1}$ respectively. The updated variable node estimates are written back to the variable node memories.

As mentioned above, one advantage of using a combined variable node update and check node update is the reduction in the number of clock cycles used to decode. In particular, because the check node processing and variable node processing is combined, there is no lost time waiting for check node messages to pass to variable node message, or vice versa. Furthermore, variable node processing need not wait for all of the check node processing to complete, since partial updates to the variable node memories are performed on the fly. Conversely, check node processing need not wait until all of the variable node memories are updated, since check node processing is also performed on the fly.

Another advantage of using a combined variable node update and check node update is a speed up in convergence in the decoding process under at least some circumstances, as less iterations are required. This occurs because the variable nodes are being updated immediately as each node processor performs its calculations. Updated variable node estimates are used immediately by node processors in performing additional check computations, rather than waiting until the completion of a decoding iteration. Because the variable nodes are updated on the fly, duplication of variable node memory is also avoided (one set of variable node storage registers are used, rather than two sets to hold values for a $k^{th}$ and $(k-1)^{th}$ iteration). As high performance LDPC codes are typically quite long (e.g., 1000's of symbols), this memory reduction can be a significant benefit.

Architectural benefits of the combined variable node update and check node update include reduced routing congestion when the decoder is implemented in hardware. Check node to variable node messages can be local to the node processors, using local routing instead of global routing. Thus, use of global routing is minimized, for example using global routing only for the variable node estimates, which are typically a small fraction of the number of messages routed in a standard decoder. This architecture is particularly beneficial for some field programmable gate array architectures which provide distributed memory throughout the chip which can be locally accessed by logic modules with reduced overhead.

The combined check node and variable node processing is particularly advantageous when applied to low-density parity codes with regular or semi-regular structure. For example, low-density parity codes can be constructed using block circulant matrices. A base matrix can be defined, and expanded into the code parity check matrix using circularly rotated identity (or more generally, diagonal) matrices. For example, an (n,k) LDPC code having m=n−k parity check rows can be constructed using a base matrix of r rows, which is expanded using T×T circulant matrices. This code can be processed using r node processors, each performing the calculations for T check nodes on a sequential basis, updating a number of variable nodes as required. The node processor calculates the variable node to check node messages for all attached variable nodes from the variable node estimates and previous check node to variable node messages, calculates new check node to variable node messages, stores the new messages, and updates the variable node estimates. Each node processor may be connected to many variable nodes. Scheduling of individual calculations in the node processor may be pipelined to provide for higher speed operation.

Figure 4B:
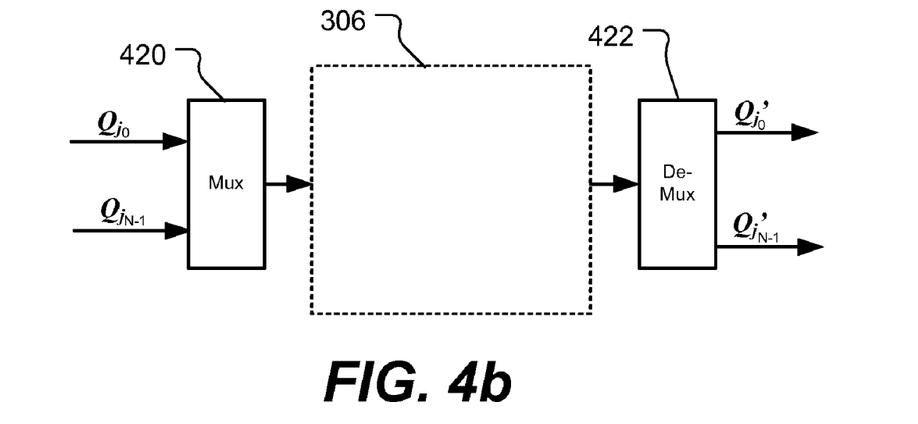
FIG. 4b is a block diagram of the node processor of FIG. 3 implemented using a multiplexer and a demultiplexer in accordance with an embodiment of the present invention.

Variable node estimates can efficiently be stored in shift registers that are connected between the node processors. Shift register lengths accordingly correspond to differences in the circulant phases of the parity check matrix. Variable node estimates from a number of different shift registers can be multiplexed 420 into a single node processor 306 input as illustrated in FIG. 4b. This allows greater flexibility in several different ways. For example, a single decoder can be used on a variety of differently sized codes. Additionally, node processors can be shared between rows in the base matrix for a tradeoff between hardware resources and decoder throughput. A demultiplexer 422 can be coupled to an output of the node processor and used to select which variable node memory or variable node memory address the updated variable node estimate is sent to as illustrated in FIG. 4b. In one embodiment, the multiplexer and demultiplexer can be implemented using a random access memory (RAM), wherein a predetermined address in the RAM can be used to select a desired variable node estimate to process or update.

Figure 5:
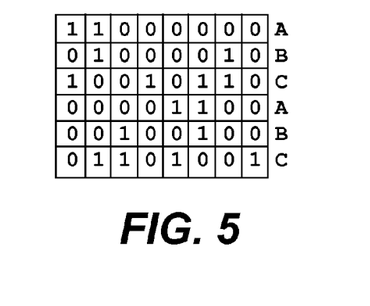
FIG. 5 is a base matrix for defining an LDPC code in accordance with an embodiment of the present invention.
Figure 6:
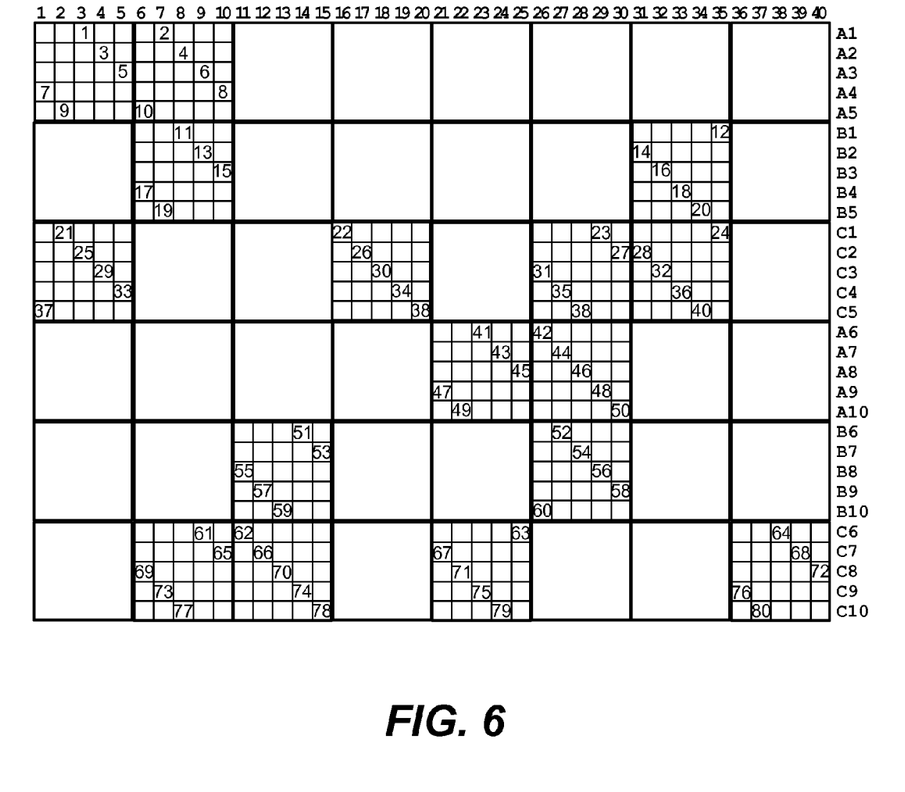
FIG. 6 is an expanded matrix for defining the parity check matrix of an LDPC code in accordance with an embodiment of the present invention.

As a particular example, FIG. 5 illustrates a base matrix which has three types of check nodes designated by rows A, B and C. Check node types A and B process two variable nodes while check node type C processes four variable nodes. Node processors can provide decoding of the base matrix at each interval, allowing larger code matrices to be processed in multiple intervals as will now be explained. The base matrix is expanded using 5×5 permutation matrices (T=5) to form the code parity check matrix as illustrated in FIG. 6. (in general, the base matrix may be expanded using circulant matrices, which may have degree of 1 or higher). The resulting parity check matrix provides for an n=40 code word (columns correspond to variable node and are numbered across the top) and implements 30 parity check equations (rows, labeled A1 . . . C10 along the right side). The parity check equations are of type A, B, or C, corresponding to the base matrix. Numbers within the matrix indicate positions where the parity check matrix has a '1' and identify check node to variable node messages as explained further below in conjunction with FIG. 7(a) and FIG. 7(b) which illustrate a decoder architecture 700 using fixed routing and segmented variable memory nodes for the exemplary code of FIG. 6 using combined variable node and check node processing. Segmented variable node memories are provided by shift registers 702 illustrated in FIG. 7(a). The shift registers of FIG. 7(a) have been labeled 1 . . . 40, corresponding to the initial position of variable node likelihoods (it will be appreciated that the variable node likelihoods are moving through the shift registers during each interval of the decoding algorithm).

In previous implementations router blocks have been used to direct the variable node likelihood values from the variable node memories to the check nodes and back. The use of router blocks requires more processing cycles or longer cycle times. In contrast, the present invention takes advantage of fixed routing of the variable node likelihood values. Fixed routing enables faster cycle times which enables higher throughput. Additionally, the variable node memories can be segmented and distributed, as illustrated in the exemplary to minimize routing delay. Together, the use of fixed routing and segmented distributed variable node memories significantly improve the performance of the LDPC decoder.

Figure 7A:
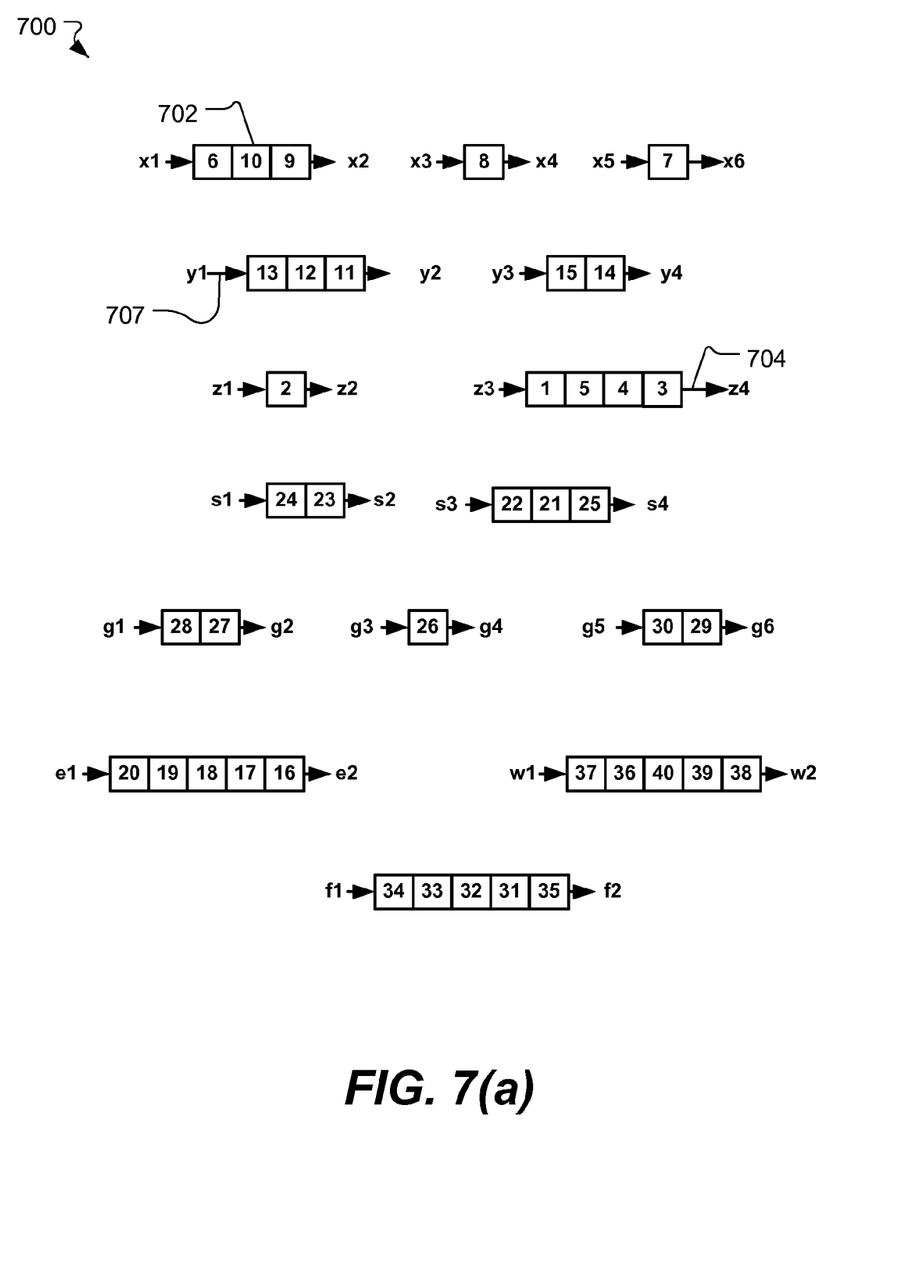
Figure 7B:
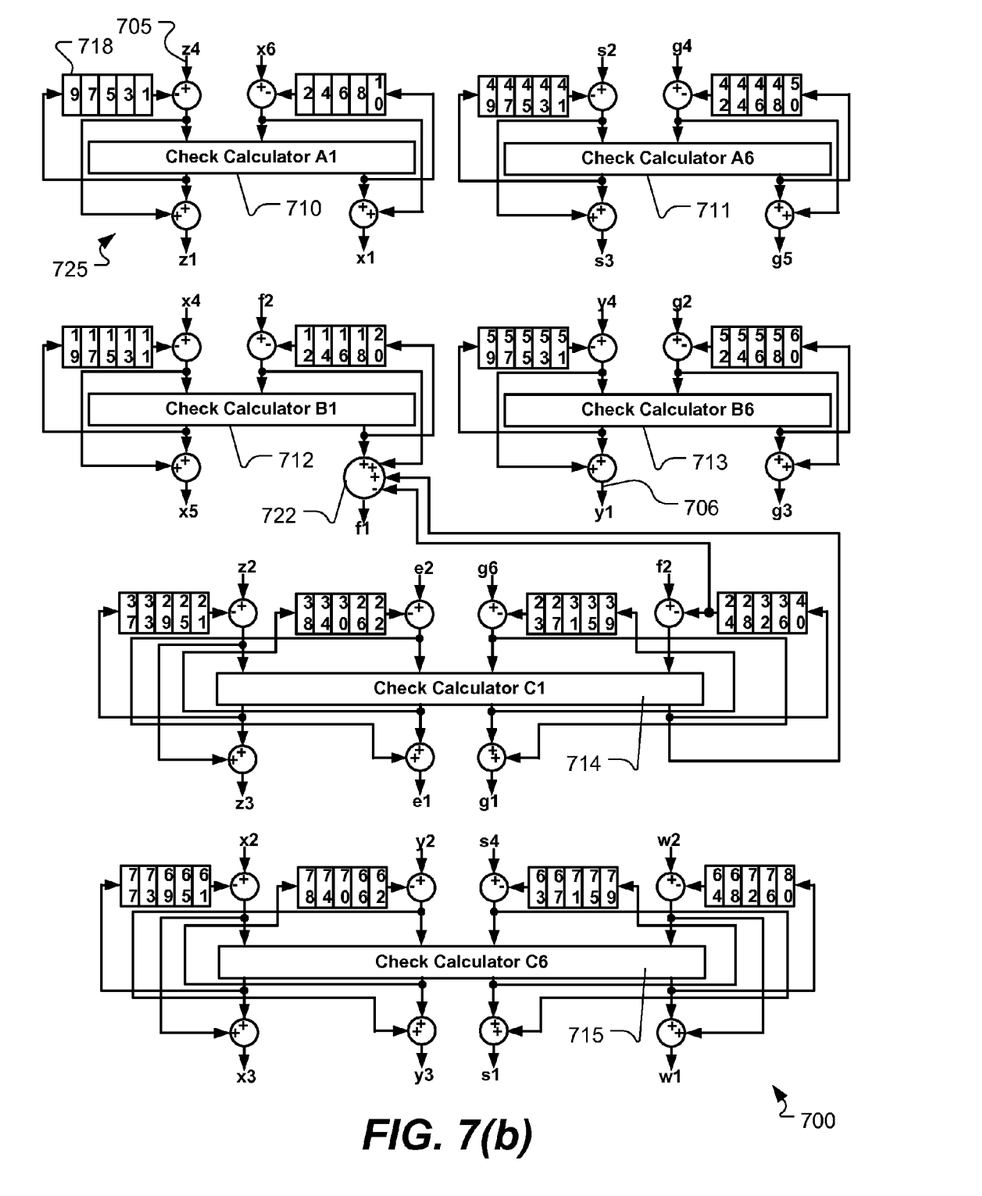

Connections from the variable node memories (shift registers) on FIG. 7(a) to node processors 725 using fixed routing in FIG. 7(b) are indicated by various letter/number combinations. For example, shift register output z4 704 from FIG. 7(a) is connected to node processor input z4 705 on FIG. 7(b). Similarly, outputs from the node processors (e.g., y1 706) are connected to inputs to the shift registers 707. The node processors include check calculators 710-715. Each node processor includes a corresponding check calculator. For example, for the parity check matrix of FIG. 6, six node processors (included check calculators are labeled A1, A6, B1, B6, C1, C6, corresponding to the rows of the base parity check matrix on which they first operate) can operate simultaneously, providing update of sixteen variable node estimates simultaneously. Since each node processor updates more than one variable node estimate, the node processors may be scheduled to avoid conflicts when attempting to update the same variable node estimate simultaneously.

From FIG. 5, the following scheduling of the node processors can be determined. The first column shows a node calculation interval (each node calculation interval may take a number of clock cycles). The next columns show the variable nodes which are updated by each of the node processors. A complete set of updates (all five intervals) is performed for each iteration of the decoder.

| Variable Nodes Updated by Each Node Processor | | | | | | | | | | | | | | | | |
|---|---|---|---|---|---|---|---|---|---|---|---|---|---|---|---|---|
| Interval | A1 | | A6 | | B1 | | B6 | | C1 | | | | C6 | | | |
| 1 | 3 | 7 | 23 | 26 | 8 | 35 | 14 | 27 | 2 | 16 | 29 | 35 | 9 | 11 | 25 | 38 |
| 2 | 4 | 8 | 24 | 27 | 9 | 31 | 15 | 28 | 3 | 17 | 30 | 31 | 10 | 12 | 21 | 39 |
| 3 | 5 | 9 | 25 | 28 | 10 | 32 | 11 | 29 | 4 | 18 | 26 | 32 | 6 | 13 | 22 | 40 |
| 4 | 1 | 10 | 21 | 29 | 6 | 33 | 12 | 30 | 5 | 19 | 27 | 33 | 7 | 14 | 23 | 26 |
| 5 | 2 | 6 | 22 | 30 | 7 | 31 | 13 | 26 | 1 | 20 | 28 | 34 | 8 | 15 | 21 | 37 |

It can be seen that variable node likelihoods 3 and 7 will be updated by check calculator A1 710 during the first interval, using check node to variable node messages 1 and 2, stored in a memory 718 local to the node processor. The updated variable node result will be needed during interval 2 by check calculator C1 714. Hence, the output of check calculator A1 corresponding to this update (z1 of FIG. 7(b)) can be passed through a length 1 shift register and provided as input (z2 of FIG. 7(b)) to check calculator C1. Accordingly, using the computation schedule shown above, the shift register lengths in FIG. 7(a) and connections to the node processors on FIG. 7(b) can be obtained.

For this particular example, a scheduling conflict arises because check calculator B1 and check calculator C1 are both scheduled to update the same variable node estimate at the same time. One option to deal with this situation is to use a parity check matrix with different shifts in the block circulant matrices to avoid such conflicts. Of course, this may not be an option (for example, if the parity check matrix is already defined) and can result in a different code. Another option is to modify the interconnections of the node processors to take this conflict into account. For example, one approach is to combine the updates provided by the two check calculators together (e.g. using adder 722 in FIG. 7(b)) before updating the variable node. In short, the variable node estimate is to be updated using check node to variable node messages from both of the check calculators. However, there are two different check node to variable node messages produced by the two different check calculators, and the previous check node to variable node messages are to be subtracted off. Remembering that the goal is to provide an updated variable node estimate which is the sum of the original channel likelihood values ($\lambda$) and appropriate check-to-variable node messages ($R_{ji}$), there are many different ways to combine the results of the two check calculators. One particular approach shown in FIG. 7(b) is to subtract off the old check to variable node message from the update from check calculator C1 before passing the update up to check calculator B1 to compute the variable node update. Other arrangements can be used to accommodate this conflict situation.

The decoder is easily extended for parity check matrices having more than one '1' in each row and column (e.g., higher degree). The variable node shift registers can include multiple tap-off points for each check node connection. The node processors can treat each connection as a separate variable node, and can include associated message memory and message calculations. This is appropriate since these multiple connections between nodes in the base matrix are between different nodes in the expanded matrix.

An LDPC decoder in accordance with embodiments of the present invention can be implemented in various ways. For example, the decoder may be implemented in a field programmable gate array or an application specific integrated circuit. Elements of the decoder may be implemented in logic gates, combinatorial logic, lookup tables, configurable logic blocks, mask programming, and the like.

It will also be appreciated that the decoder may be implemented partially or entirely in software. Software may be tangibly embodied in the form of computer readable instructions stored in a machine-readable storage device for execution by a programmable processor. The programmable processor may execute the computer readable instructions to implement a decoding method, accepting input data as described above and generating output as described above. One or more programmable processors may be used, and portions of the processing allocated to the processors according to a pre-defined schedule or on an as-available basis.

The software may be implemented in a high-level procedural or object-oriented programming language, in assembly language, machine language, or other form, and translated into machine executable instructions for execution. Translation into machine-readable instructions may be via a compiler, interpreter, or the like, and may occur before, during, or in part before and in part during execution of the machine-readable instructions.

Suitable processors include, by way of example, both general and special purpose microprocessors. Generally, a processor will receive instructions and data from a read-only memory and/or a random access memory. Processors may also include on-chip cache memory from which instructions are stored and accessed. Generally, a computer includes one or more mass storage devices for storing data files. Mass storage devices include, for example, magnetic disks, such as internal hard disks and removable disks; magneto-optical disks; and optical disks. Storage devices suitable for tangibly embodying computer program instructions and data include various forms of non-volatile memory, including by way of example, semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits) and/or FPGAs (field-programmable gate arrays).

Figure 8:
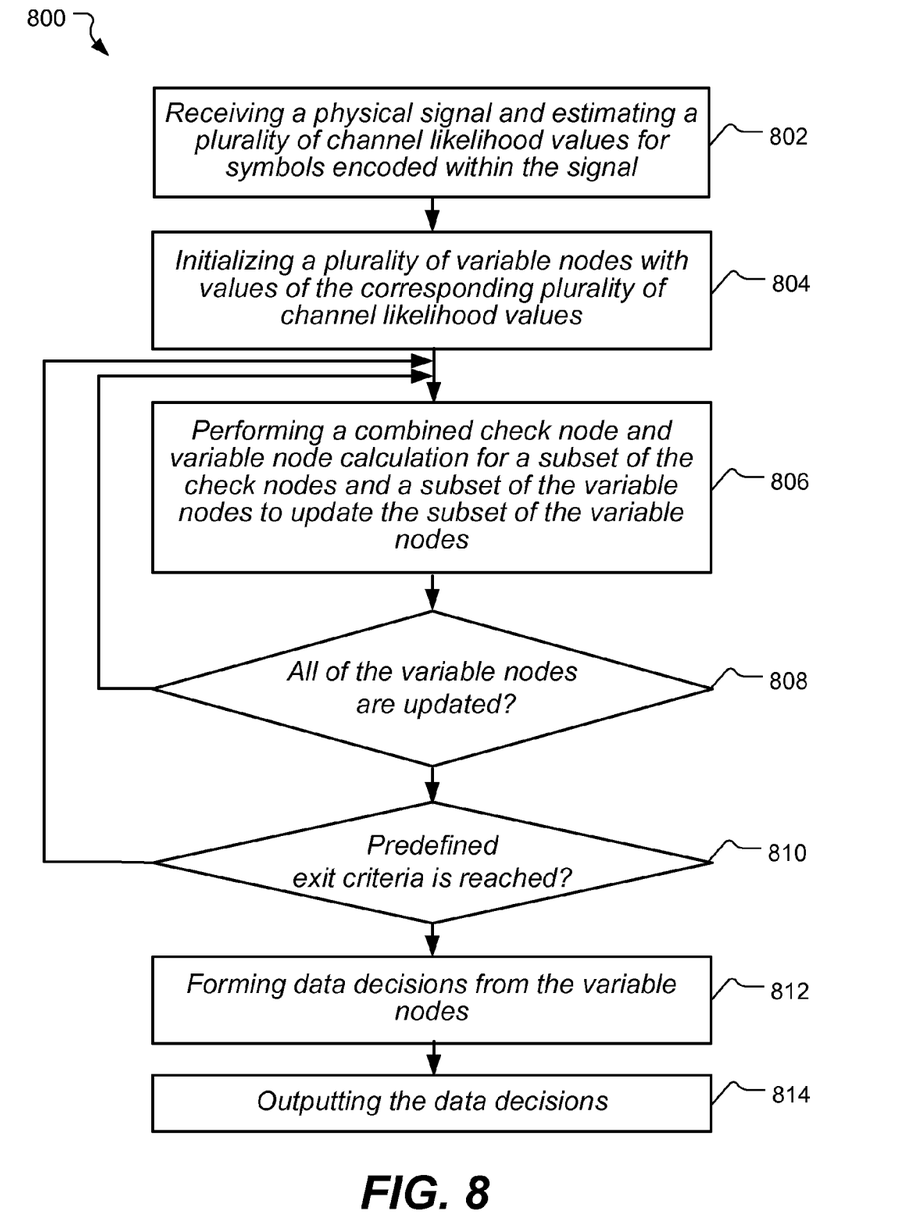
FIG. 8 is a flow chart of a method for decoding a LDPC code in accordance with an embodiment of the present invention.

A method of decoding a low-density parity check code will now be described in conjunction with the flow chart of FIG. 8. The method 800 can include receiving 802 a physical signal and estimating a plurality of channel likelihood values for symbols encoded within the signal. Various signal formats can be used including, for example, spread and non-spread spectrum signals. Symbol modulation may include, for example, phase shift keying, frequency shift keying, amplitude shift keying, or combinations thereof. Symbols may be encoded onto the signal using multi-carrier techniques, such as multi-carrier spread spectrum, orthogonal frequency division multiplexing, or the like. Symbols may be encoded using a binary or higher order alphabet. Depending on the signal modulation format, carrier frequency, and other aspects of the signal, implementation of the receiver may include components such as antennas, low noise amplifiers, downconverters, filters, frequency reference sources, local oscillators, tracking loops, analog to digital converters, and the like.

As another example, the physical signal may be provided to the decoder in the form of a digitized signal, for example, as output by a downconverter or digitizer.

Likelihood values may be represented as log-likelihood ratios or other formats as known in the art. For example, a log likelihood ratio can be calculated as:

$$\lambda_i = \log \frac{Pr\{c_i = 0 \mid r_i\}}{Pr\{c_i = 1 \mid r_i\}}$$

where $r_i$ is the received symbol corresponding to symbol $c_i$ of the received signal.

The method 800 can also include initializing 804 a plurality of variable nodes with values of the corresponding plurality of channel likelihood values. As described above, the variable nodes may be implemented in a memory, and the channel likelihood values clocked or stored into the memory for initialization.

Another step of the method 800 is performing 806 a combined check node and variable node calculation. The calculation is, for example, as described above. The calculation is performed for a subset of the check nodes and a subset of the variable nodes to update the subset of the variable nodes. More particularly, a semi-parallel architecture is provided, where a number of combined check node and variable node updates are performed in parallel. The combined check node and variable node calculation is repeated 808 until all variable nodes are updated. The updating of all variable nodes is referred to as an iteration of the decoder.

Iteration of the decoder continues, repeating 810 the update of variable nodes until a predefined exit criterion is reached. For example, the predefined exit criterion may be that the combined check node and variable node calculation is producing check node to variable node messages with even parity (in other words, no corrections to the variable node likelihoods are required). This corresponds to the parity check equations being satisfied, indicating convergence to a code word. Typically, this will be correct decoding, although there is a possibility that convergence will be to an incorrect code word when there are high channel errors rates. An incorrect code word accordingly results in residual errors. Other predetermined exit criteria can be used as well, as described above.

The method 800 can include forming 812 data decisions from the variable nodes. For example, data decisions may be formed as hard decisions as described above. Alternately, data decisions may be output as soft decisions if further processing is desired (e.g., with concatenated codes). The data decisions can then be output 814. For example, data decisions may be output to a processor for further processing, stored in a memory for later use, printed or displayed to a user, or transferred to another system.

Performing a combined check node and variable node calculation can include retrieving likelihood values from the variable nodes, subtracting corresponding check node to variable node message to form variable node to check node messages having extrinsic data. A check calculation is performed using multiple variable node to check node messages (i.e., from all variable nodes that contributed to the check node) to form check node to variable node messages. The check node to variable node messages are saved (for later use in obtaining the extrinsic data portion of variable node to check node messages). The variable node estimates are then updated using the check node to variable node message and the extrinsic data.

Summarizing and reiterating to some extent, it will be appreciated that several advantages are provided by the presently disclosed inventive techniques. The foregoing examples are necessarily limited in complexity in the interest of brevity. Alternate arrangements of a LDPC decoder similar to the above examples will occur to one of skill in the art. Benefits of the disclosed decoder include faster operation as compared to a conventional two-step message passing algorithm, as variable nodes can be updated on the fly. For example, throughput increases of a factor of two may be obtained. The present decoder provides partial updates of variable nodes as soon as updating information is available from a check node calculation. In addition to reducing memory (since two sets of variable node values need not be saved), the immediate updates of variable nodes can provide faster convergence. The clock speed can also be increased, particularly in a pipelined implementation. Through the effects of faster convergence, fewer decoding stages, and increased clock speed, speed improvement of 3× to 4× or more may be obtained as compared to conventional two-step message passing algorithms.

Scheduling of decoding operations can allow for a semi-parallel architecture where multiple processing nodes update variable nodes simultaneously. Decoders using the presently disclosed techniques are particularly suitable for implementation in a field programmable gate array and application specific integrated circuits. In particular, memory distributed within the FPGA or ASIC can be used to hold check node to variable node messages in memory local to node processors, helping to reduce routing congestion.

It is to be understood that the above-referenced arrangements are illustrative of the application for the principles of the present invention. It will be apparent to those of ordinary skill in the art that numerous modifications can be made without departing from the principles and concepts of the invention as set forth in the claims.

What is claimed is:

1. A decoder for a quasi-cyclical low-density parity check code, comprising:
   a plurality of node processors each configured to perform a combined check node and variable node calculation on a variable node likelihood value at an input of the node processor using a check to variable node message to produce an updated variable node likelihood value at an output of the node processor
   a plurality of variable node memories providing storage for a plurality of variable node likelihood values, wherein the plurality of variable node memories comprise shift registers, each of the shift registers having a fixed time delay and connecting an output of one of the node processors to an input of one of the node processors; and
   a plurality of message memories coupled to the node processors, each message memory being associated with one of the node processors and having storage for a plurality of the check to variable node messages.

2. The decoder of claim 1, wherein each of the node processors comprises:
   a plurality of subtractors, wherein one of the subtractors is configured to subtract the check to variable node message from the variable node likelihood value at the input of the node processor to obtain an extrinsic likelihood value;
   a check calculator coupled to the subtractor and configured to process the extrinsic likelihood value to form a new check to variable node message; and
   a plurality of adders coupled to the check calculator and the plurality of subtractors, wherein one of the adders is configured to add the extrinsic likelihood value to the new check to variable node message to produce the updated variable node likelihood value at the output of the node processor.

3. The decoder of claim 1, wherein the decoder is implemented in a field programmable gate array.

4. The decoder of claim 1, wherein the decoder is implemented in an application specific integrated circuit.

5. The decoder of claim 1, wherein the node processors are implemented by at least one computer processor.

6. A communication system using the decoder of claim 1.

7. The decoder of claim 1, wherein one of shift registers connects the output of one of the node processors to the input of a different one of the node processors.

8. The decoder of claim 1, wherein one of the shift registers connects the output of one of the node processors to the input of the same one of the node processors.

9. The decoder of claim 1, wherein each of the node processors is further configured to perform the combined check node and variable node calculation by:
   generating a variable to check node message from the variable node likelihood value at the input of the node processor and the check to variable node message,
   performing a check calculation on the variable to check node message to produce a new check to variable node message, and
   generating the updated variable node likelihood value at the output of the node processor from the variable to check node message and the new check to variable node message.

10. The decoder of claim 1, wherein the fixed time delay of a first one of the shift registers is different than the fixed time delay of a second one of the shift registers.

11. A method of decoding a quasi-cyclical low-density parity check code, the method comprising:
   obtaining initial variable node likelihood values for symbols in a received signal;
   performing, in a plurality of node processors with check to variable node messages stored in a plurality of message memories, combined check node and variable node calculations on the variable node likelihood values at inputs of the node processors to update the variable node likelihood values;
   providing the updated variable node likelihood values from outputs of the node processors through fixed time delay paths to inputs of at least some of the node processors, wherein each of the fixed time delay paths comprises a shift register connecting an output of one of the node processors to an input of one of the node processes; and
   repeating the performing and the providing until a predefined exit criterion is reached.

12. The method of claim 11, wherein the performing the combined check node and variable node calculation in one of the node processors comprises:
   generating a variable to check node message from the variable node likelihood value at the input of the one of the node processors and one of the check to variable node messages in one of the message memories connected to the one of the node processors,
   performing a check calculation on the variable to check node message to produce a new check to variable node message, and
   generating the updated variable node likelihood value at the output of the one of the node processors from the variable to check node message and the new check to variable node message.

13. The method of claim 12 further comprising storing the new check to variable node message in one of the message memories.

14. The method of claim 11, wherein the performing the combined check node and variable node calculation in one of the node processors comprises:
- subtracting one of the check to variable node messages in one of the message memories connected to the one of the node processors from the variable node likelihood value at the input of the one of the node processor to produce a variable to check node message,
- performing a check calculation on the variable to check node message to produce a new check to variable node message, and
- adding the variable to check node message and the new check to variable node message to produce the updated variable node likelihood value at the output of the one of the node processors.

15. The method of claim 14 further comprising storing the new check to variable node message in one of the message memories connected to the one of the node processors.

16. The method of claim 11, wherein a first one of the fixed time delay paths has a longer time delay than a second one of the fixed time delay paths.

17. The method of claim 11, wherein one of the fixed time delay paths connects the output of one of the node processors to the input of a different one of the node processors.

18. The method of claim 11, wherein one of the fixed time delay paths connects the output of one of the node processors to the input of the same one of the node processors.

\* \* \* \* \*